(12) United States Patent
Tsao et al.

(10) Patent No.: US 8,552,529 B2
(45) Date of Patent: Oct. 8, 2013

(54) SEMICONDUCTOR DEVICE

(75) Inventors: Jung-Chih Tsao, Taipei (TW); Yu-Sheng Wang, Tainan (TW); Kei-Wei Chen, Yonghe (TW); Ying-Lang Wang, Longjing Township, Taichung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/488,958

(22) Filed: Jun. 5, 2012

(65) Prior Publication Data

US 2012/0241908 A1 Sep. 27, 2012

Related U.S. Application Data

(63) Continuation-in-part of application No. 11/733,897, filed on Apr. 11, 2007.

(51) Int. Cl.
*H01L 21/02* (2006.01)

(52) U.S. Cl.
USPC .................................. 257/532; 257/E29.342

(58) Field of Classification Search
USPC ........................................ 257/532, E29.342
See application file for complete search history.

(56) References Cited

U.S. PATENT DOCUMENTS

| 4,364,099 | A | 12/1982 | Koyama et al. | |
| 5,281,485 | A * | 1/1994 | Colgan et al. | 428/457 |
| 5,929,475 | A | 7/1999 | Uemoto et al. | |
| 2005/0121744 | A1* | 6/2005 | Chang et al. | 257/532 |
| 2005/0155677 | A1 | 7/2005 | Wickersham, Jr. | |

FOREIGN PATENT DOCUMENTS

CN 1180465 4/1998

OTHER PUBLICATIONS

Chinese language office action dated Sep. 17, 2009.

* cited by examiner

*Primary Examiner* — Marvin Payen
(74) *Attorney, Agent, or Firm* — McClure, Qualey & Rodack, LLP (57) ABSTRACT

A semiconductor device is disclosed. The device includes a substrate; a first metal layer overlying the substrate; a dielectric layer overlying the first metal layer; and a second metal layer overlying the dielectric layer, wherein the first metal layer comprises: a first body-centered cubic lattice metal layer; a first underlayer, underlying the first body-centered cubic lattice metal layer, wherein the first underlayer is metal of body-centered cubic lattice and includes titanium (Ti), tungsten (W), molybdenum (Mo) or niobium (Nb); and a first interface of body-centered cubic lattice between the first body-centered cubic lattice metal layer and the first underlayer.

6 Claims, 10 Drawing Sheets

SEMICONDUCTOR DEVICE

CROSS REFERENCE TO RELATED APPLICATIONS

This application is a Continuation-In-Part of U.S. patent application Ser. No. 11/733,897, filed Apr. 11, 2007, the disclosure of which is hereby incorporated by reference herein in its entirety.

BACKGROUND OF THE INVENTION

1. Field of the Invention

The invention relates to semiconductor technology and more particularly to metal-insulator-metal capacitors.

2. Description of the Related Art

Capacitors are elements used extensively in semiconductor devices for storing an electrical charge or parallel connection with an inductor to be an LC oscillator for signal radiation. Capacitors essentially comprise two conductive plates separated by a dielectric material, and are also used in filters, analog-to-digital converters, memory devices, control applications, and many other types of semiconductor devices.

One type of capacitor is a metal-insulator-metal (MIM) capacitor, which is frequently used in mixed signal devices and logic devices, such as embedded memories and radio frequency devices. Metal-insulator-metal capacitors are used to store a charge in a variety of semiconductor devices. A metal-insulator-metal capacitor is typically formed horizontally on a semiconductor wafer, with two metal plates sandwiching a dielectric layer parallel to the wafer surface. In the radio frequency device applications, tantalum nitride films are often utilized as the metal plates of the metal-insulator-metal capacitors.

The resistivity of a tantalum nitride is typically between 150 and 250 $\mu\Omega$-cm. In some cases, the value is too high for an integral of a semiconductor device. Thus, a technology for lowering the resistivity of plates of metal-insulator-metal capacitors is desirable.

BRIEF SUMMARY OF THE INVENTION

The invention provides semiconductor devices providing metal-insulator-metal capacitors comprising metal plates with lower resistivity.

The invention provides a semiconductor device, comprising: a substrate; a first metal layer overlying the substrate; a dielectric layer overlying the first metal layer; and a second metal layer overlying the dielectric layer, wherein the first metal layer comprises: a first body-centered cubic lattice metal layer; a first underlayer, underlying the first body-centered cubic lattice metal layer, wherein the first underlayer is metal of body-centered cubic lattice and comprises titanium (Ti), tungsten (W), molybdenum (Mo) or niobium (Nb); and a first interface of body-centered cubic lattice between the first body-centered cubic lattice metal layer and the first underlayer.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
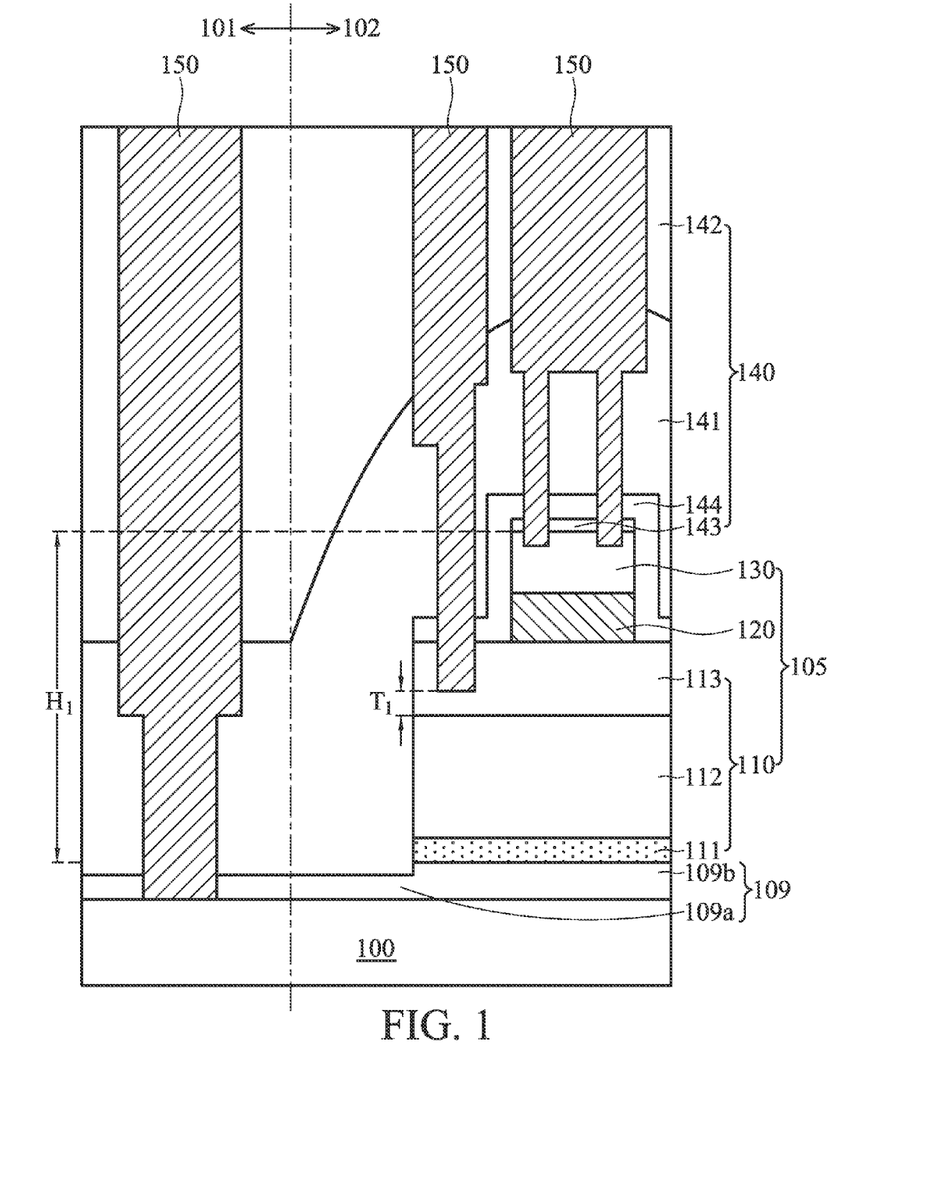
FIG. 1 shows a cross section of a first embodiment of the inventive semiconductor device.

FIG. 1 shows a cross section of a first embodiment of the inventive semiconductor device. The semiconductor device comprises a substrate 100, a metal-insulator-metal capacitor 105, an inter-layer dielectric 140, and a wiring layer 150.

The substrate 100 comprises semiconductor materials such as silicon, germanium, silicon germanium, compound semiconductor, or other known semiconductor materials, but is a silicon wafer in this embodiment. In an alternative embodiment, the substrate 100 may be a substrate for a display, a light emitting device, or other. Active devices, such as transistors, diodes, or other devices can be formed in the substrate 100, but are not shown for clarity. In some cases, the substrate 100 may comprise other inter-layer dielectrics and wiring layer underlying the metal-insulator-metal capacitor 105, the inter-layer dielectric 140, and the wiring layer 150, but are not shown for clarity. In this embodiment, the substrate 100 comprises an optional overlying etch stop layer 109, and the overlying etch stop layer 109 preferably comprises SiN. The overlying etch stop layer 109 comprises portions 109a and 109b, and details thereof are subsequently described.

The substrate 100 comprises a logic area 101 and a non-logic area 102. Most of the active devices are typically formed in the logic area 101. The non-logic area 102 may be an analog area, a peripheral circuit area, a memory area, a communication area, or other areas. In this embodiment, the non-logic area 102 is a communication area comprising radio frequency (RF) devices.

The metal-insulator-metal capacitor 105 is disposed overlying the substrate 100 in the non-logic area 102. In this embodiment, the metal-insulator-metal capacitor 105 is disposed on the portion 109b of the overlying etch stop layer 109 of the substrate 100. An inductor may also be disposed in the non-logic area 102 in parallel with the metal-insulator-metal capacitor 105 to form an LC oscillator for signal radiation, but is not shown for clarity.

Dielectric layers 141 and 142, such as USG (undoped silicate glass) layers, are sequentially formed overlying the substrate 100 and the metal-insulator-metal capacitor 105, forming the inter-layer dielectric 140. In an alternative embodiment, the dielectric layers 141 and 142 may be known low-k dielectrics, particularly those with dielectric constant lower than 3. The inter-layer dielectric 140 may optionally comprise etch stop layers 143 and 144 overlying the metal-insulator-metal capacitor 105, and detail descriptions therefor are subsequently listed. The wiring layer 150, such as tungsten, copper, or other conductive materials, are then embedded in the inter-layer dielectric 140. The wiring layer 150 in the logic area 101 electrically contacts or connects the active devices. The wiring layer 150 in the non-logic area 102 electrically contacts the metal-insulator-metal capacitor 105.

The metal-insulator-metal capacitor 105 comprises a bottom plate 110, a dielectric layer 120 overlying the bottom plate 110, and a top plate 130 overlying the dielectric layer 120. The bottom plate 110 extends horizontally from the stack of the bottom plate 110, the dielectric layer 120, and the top plate 130. Thus, at least one of the wiring layers can electrically contact the bottom plate 110. In this embodiment, the wiring layer 150 electrically contacts the bottom plate 110 and the top plate 130 respectively. The material of the dielectric layer 120 may be selected from any known dielectrics, depending on the designed capacitance of the metal-insulator-metal capacitor 105, the process integrity, or other factors.

The bottom and top plates 110 and 130 can be any known conductive materials, but are tantalum nitride in this embodiment. The top plate 110 further comprises two tantalum nitride layers 111 and 113 sandwiching a low-resistance layer, such as an aluminum-copper alloy layer 112. The resistivity of the aluminum-copper alloy layer 112 is typically between 2 and 3 $\mu\Omega$-cm, which is much lower than that of tantalum nitride. Thus, the introduction of the aluminum-copper alloy layer 112 into the bottom plate 110 assists in decreasing the integral resistance of the bottom plate 110.

Further, the wiring layer 150 may extend into the bottom plate 110 to reduce the contact resistance therebetween as shown in FIG. 1. In some cases, the wiring layer 150 extends into the tantalum nitride layer 113, but the remaining thickness $T_1$ of the tantalum nitride layer 113 below the wiring layer 150 is preferably greater than 100 Å for requirement of process integration for the whole wiring layer 150. In some embodiments, the wiring layer 150 may also extend into the top plate 130 to reduce the contact resistance therebetween.

The tantalum nitride layer 111 is preferably between 100 and 300 Å thick, and is approximately 200 Å in this embodiment. The aluminum-copper alloy layer 112 is preferably between 500 and 1500 Å thick for substantially and effectively lowering the resistance of the bottom plate 110, and is approximately 1200 Å in this embodiment. The tantalum nitride layer 113 is preferably between 500 and 700 Å thick, and is approximately 600 Å in this embodiment. The dielectric layer 120 is preferably between 200 and 500 Å thick, and is approximately 380 Å in this embodiment. The top plate 130 is preferably between 400 and 600 Å thick, and is approximately 500 Å in this embodiment.

As described, the introduction of the aluminum-copper alloy layer 112 into the bottom plate 110 assists in decreasing the integral resistance of the bottom plate 110. The introduction of the aluminum-copper alloy layer 112, however, also increases the overall thickness of the metal-insulator-metal capacitor 105, and thus, increases the step difference between the logic area 101 and the non-logic area 102 prior to formation of the inter-layer dielectric 140 and the wiring layer 150. In this embodiment, the step difference $H_1$ between the logic area 101 and the non-logic area 102 prior to formation of the inter-layer dielectric 140 and the wiring layer 150 is approximately 2880 Å, and the thickness ratio of the aluminum-copper alloy layer 112 in the metal-insulator-metal capacitor 105 exceeds 40 percent.

The inventors have discovered that such a high step difference between the logic area 101 and the non-logic area 102 may substantially negatively affect the subsequent formation of the inter-layer dielectric 140 and the wiring layer 150.

For example, subsequent to formation of the dielectric layer 141 utilizing a deposition process such as chemical vapor deposition, a planarization step is performed to improve the surface topography of the substrate 100. The dielectric layer 141 has a step gradient area between the logic area 101 and the non-logic area 102 resulting from the described step difference. The planarization for the dielectric layer 141 typically utilizes a chemical mechanical polishing method, during which a lot of chemicals and particles utilized in the method may remained in the step gradient area. The chemical and particle residuals may flow into subsequently formed vias and trenches where the wiring layer 150 is embedded, increasing the resistance of the wiring layer 150 or causing the wiring layer 150 to be open.

The semiconductor devices of the subsequent second and third embodiments are modifications of those of the first embodiment. Considering that the thickness ratio of the aluminum-copper alloy layer 112 in the metal-insulator-metal capacitor 105 exceeds 40 percent, reducing usage of the aluminum-copper alloy layer 112 may be effective in decreasing the complete thickness of the metal-insulator-metal capacitor 105 to reduce the step difference $H_1$.

Figure 2:
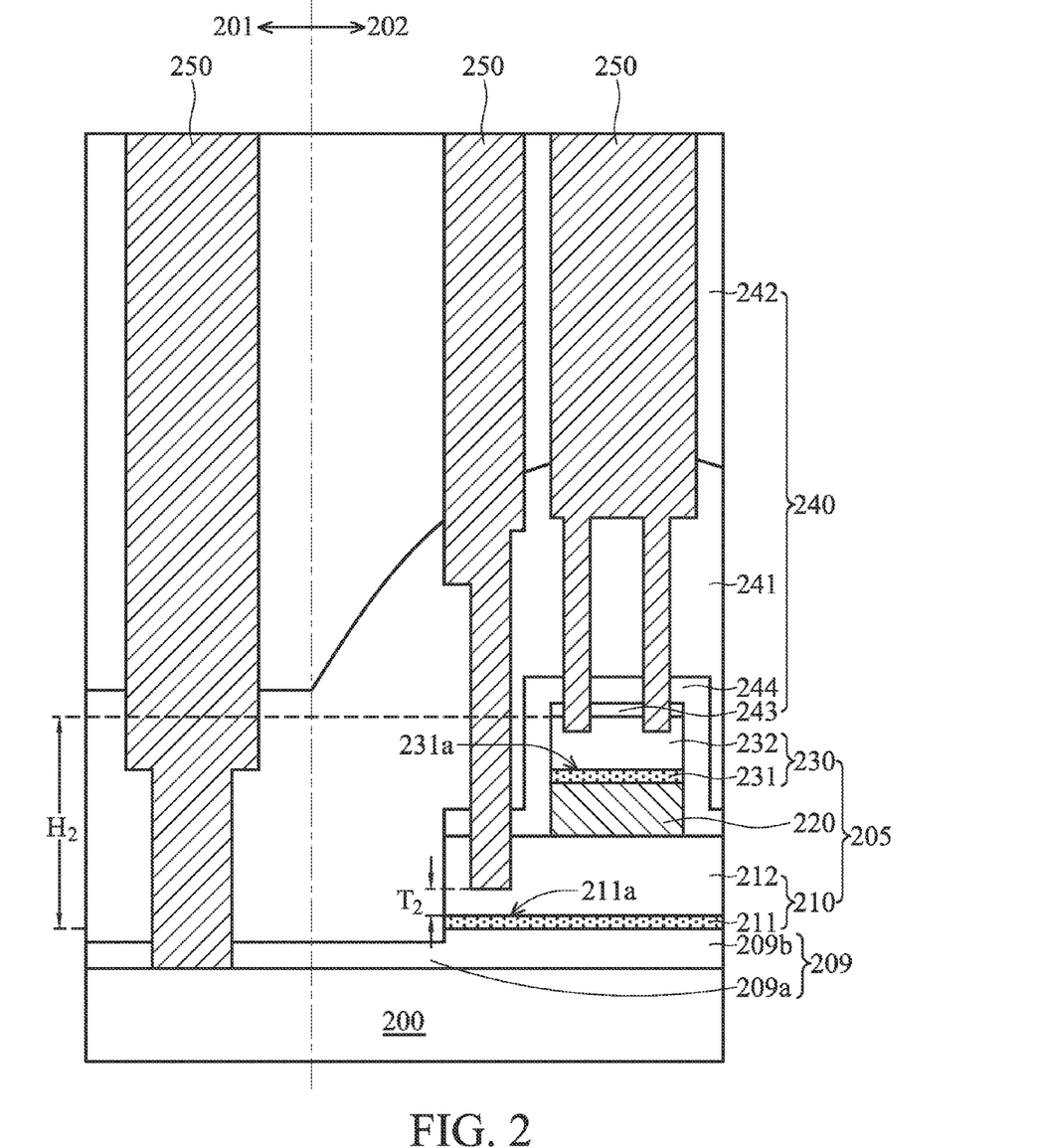
FIG. 2 shows a cross section of a second embodiment of the inventive semiconductor device.

FIG. 2 shows a cross section of a second embodiment of the inventive semiconductor device. The semiconductor device comprises a substrate 200, a metal-insulator-metal capacitor 205, an inter-layer dielectric 240, and a wiring layer 250. Description of the substrate 200 including the logic area 201, the non-logic area 202, and the optional overlying etch stop layer 209 comprising the portions 209a and 209b, the inter-layer dielectric 240 including the dielectric layers 241 242 and the optional etch stop layers 243, 244, the thickness $T_2$, and the wiring layer 250 are similar to the descriptions of the substrate 100 including the logic area 101, the non-logic area 102, and the optional overlying etch stop layer 109 comprising the portions 109a and 109b, the inter-layer dielectric 140 including the dielectric layers 141, 142 and the optional etch stop layers 143, 144, the thickness $T_1$, and the wiring layer 150 of the first embodiment, and thus, further description thereof is omitted.

The metal-insulator-metal capacitor 205 comprises a bottom plate 210, a dielectric layer 220 overlying the bottom plate 210, and a top plate 230 overlying the dielectric layer 220. The bottom plate 210 extends horizontally from the stack of the bottom plate 210, the dielectric layer 220, and the top plate 230. Thus, at least one of the wiring layers can electrically contact the bottom plate 210. Further, Description of the dielectric layer 220 are the same as the description of the dielectric layer 120 of the first embodiment, and thus, further description thereof is omitted.

The bottom plate 210 is typically metal, and comprises metal of body-centered cubic lattice to lower the resistivity thereof. Thus, the top plate 230 is typically metal, and preferably comprises metal of body-centered cubic lattice. In some embodiments, the bottom plate 210 and the top plate 230 respectively comprise metal layers 212, and 232 and nitride layers 211, and 231. The metal layers 212 and 232 are of body-centered cubic lattice. The nitride layers 211 and 231 are disposed underlying the metal layers 212 and 232, respectively, and are nitride of the composition of the metal layers 212 and 232, respectively. An interface 211a between the nitride layers 211 and the metal layers 212 is of body-centered cubic lattice for nucleation and grain growth of the metal layers 212 during processing. Similarly, an interface 231a between the nitride layers 231 and the metal layers 232 is of body-centered cubic lattice for nucleation and grain growth of the substantially nitrogen-free metal layers 232 during processing. In some embodiments, the metal of body-centered cubic lattice in the bottom plate 210 and top plate 230 may comprise niobium, tantalum, thallium, or a combination thereof.

In some embodiments, to ensure the process integrity for fabricating the complete semiconductor device, the metal of body-centered cubic lattice in the bottom plate 210 and top plate 230 is preferably tantalum compatible with the metallization process for the semiconductor device, such as the step to fabricate barrier layers (not shown) of the wiring layer 250. In this embodiment, thus, the substantially metal layers 212 and 232 are respectively tantalum containing layers of body-centered cubic lattice, the nitride layers 211 and 231 are respectively tantalum nitride layers, and the interfaces 211a and 231a are $TaN_x$. The interfaces 211a and 231a are of body-centered cubic when x is substantially 0.1. In some embodiments, the metal layer 212 is $TaN_a$ of body-centered cubic lattice, wherein a is less than 0.5 but not zero, but more preferably between 0.1 and 0.3. In other embodiments, the metal layer 212 is substantially nitrogen-free tantalum of body-centered cubic lattice. Similarly, the metal layer 232 may be $TaN_b$ of body-centered cubic lattice, wherein b is less than 0.5 but not zero, but more preferably between 0.1 and 0.3, or substantially nitrogen-free tantalum of body-centered cubic lattice.

In this embodiment, the tantalum nitride layer 211 is preferably between 10 and 200 Å thick, and more preferably approximately 60 Å thick. The tantalum layer 212 is preferably between 300 and 600 Å thick, and more preferably approximately 400 Å thick. The dielectric layer 220 is preferably between 200 and 500 Å thick, and more preferably approximately 380 Å thick. The tantalum nitride layer 231 is preferably between 10 and 200 Å thick, and more preferably approximately 60 Å thick. The tantalum layer 232 is preferably between 300 and 600 Å thick, and more preferably approximately 400 Å thick. The step difference $H_2$ between the logic area 201 and the non-logic area 202 prior to formation of the inter-layer dielectric 240 and the wiring layer 250 is approximately 200 Å, much lower than the value of $H_1$ in the first embodiment. Thus, the second embodiment achieves the resistance decrease to the bottom plate 210 and top plate 230, with one of the additional benefits which is lower step difference $H_2$.

When the weight of lower resistance is larger than the weight for lower step difference of the substrate, an aluminum-copper alloy layer, for example, can be introduced into the bottom plate 210 comprising metal of nitrogen-free body-centered cubic lattice.

Figure 3:
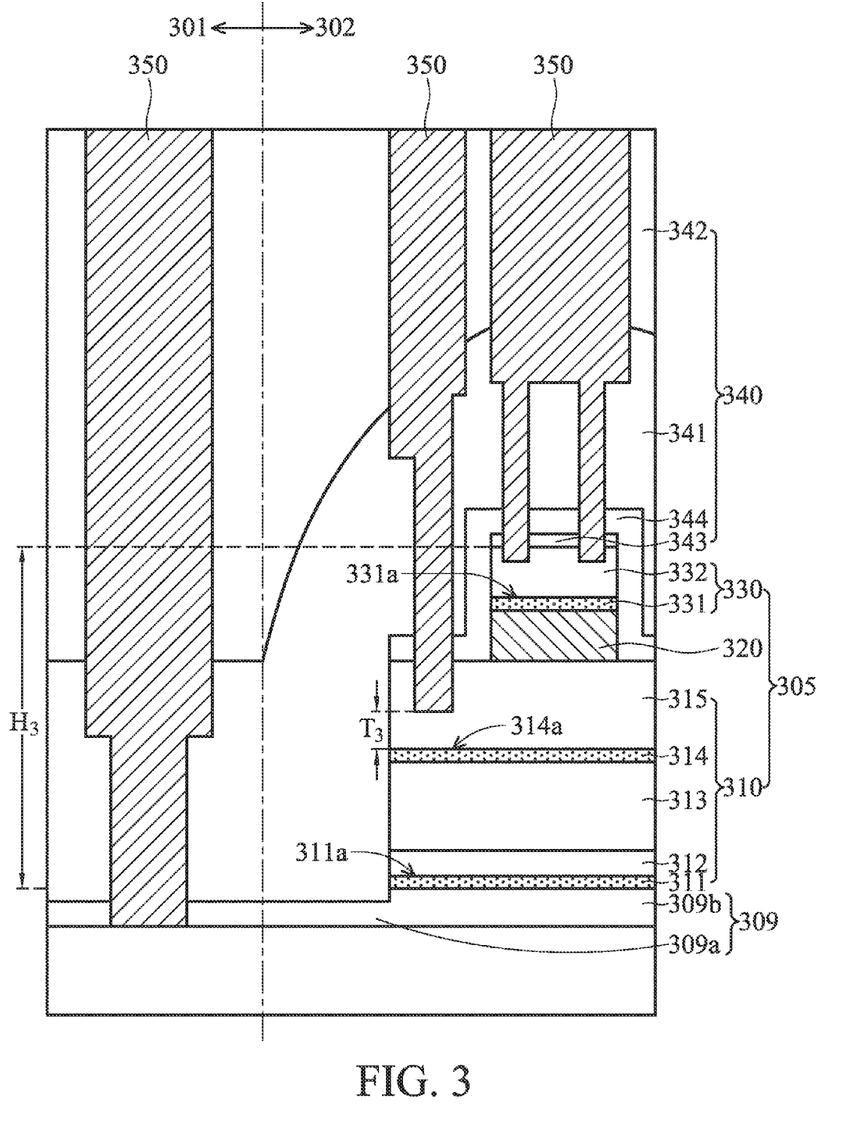
FIG. 3 shows a cross section of a third embodiment of the inventive semiconductor device.

FIG. 3 shows a cross section of a third embodiment of the inventive semiconductor device. The semiconductor device comprises a substrate 300, a metal-insulator-metal capacitor 305, an inter-layer dielectric 340, and a wiring layer 350. Description of the substrate 300 including the logic area 301, the non-logic area 302, and the optional overlying etch stop layer 309 comprising the portions 309a and 309b, the inter-layer dielectric 340 including the dielectric layers 341, 342 and the optional etch stop layers 343, 344, the thickness $T_3$, and the wiring layer 350 are similar with the description for the substrate 100 including the logic area 101, the non-logic area 102, and the optional overlying etch stop layer 109 comprising the portions 109a and 109b, the inter-layer dielectric 140 including the dielectric layers 141, 142 and the optional etch stop layers 143, 144, the thickness $T_3$, and the wiring layer 150, and thus, further description thereof is omitted.

The metal-insulator-metal capacitor 305 comprises a bottom plate 310, a dielectric layer 320 overlying the bottom plate 310, and a top plate 330 overlying the dielectric layer 320. The bottom plate 310 extends horizontally from the stack of the bottom plate 310, the dielectric layer 320, and the top plate 330. Thus, at least one of the wiring layers can electrically contact the bottom plate 310. Description of the top plate 330, including the nitride layer 331, the substantially nitrogen-free metal layer 232, and the interface 331a, and the dielectric layer 320 are similar with the description of the top plate 330, including the nitride layer 231, the substantially nitrogen-free metal layer 232, and the interface 231a, and the dielectric layer 220 in the second embodiment, and thus, further description thereof is omitted.

The bottom plate 310 comprises a nitride layer 311, a metal layer 312, an aluminum-copper alloy layer 313, a nitride layer 314, and a metal layer 315. The combination of the nitride layer 311 and the metal layer 312, and the combination of the nitride layer 314 and the metal layer 315 sandwiches the aluminum-copper alloy layer 313. Introducing the aluminum-copper alloy layer 313 further decreases the resistance of the bottom plate 310. In some embodiments, similar materials may be introduced on the top plate 330 for the decrease resistance. Description of the nitride layers 311, 314, the metal layers 312, 315, and the interfaces 311a, 314a are similar with the description of the nitride layer 211, the metal layers 212, and the interface 211a in the second embodiment, and thus, further description thereof is omitted.

In this embodiment, similar with the second embodiment, to ensure process integrity for fabricating the complete semiconductor device, the metal of body-centered cubic lattice in the bottom plate 310 and top plate 330 is preferably tantalum to be compatible with the metallization process for the semiconductor device, such as the step to fabricate barrier layers (not shown) of the wiring layer 350. In this embodiment, the metal layers 312, 315, and 332 are thus respectively tantalum containing layers of body-centered cubic lattice, the nitride layers 311, 314 and 331 are respectively tantalum nitride layers, and the interfaces 311a, 314a, and 331a are $TaN_x$. The interfaces 311a, 314a, and 331a are of body-centered cubic lattice when x is substantially 0.1. In some embodiments, the metal layer 312 is $TaN_a$ of body-centered cubic lattice, wherein a is less than 0.5 but not zero, but more preferably between 0.1 and 0.3. In other embodiments, the metal layer 312 is substantially nitrogen-free tantalum of body-centered cubic lattice. Similarly, the metal layer 315 may be $TaN_b$ of body-centered cubic lattice, wherein b is less than 0.5 but not zero, but more preferably between 0.1 and 0.3, or substantially nitrogen-free tantalum of body-centered cubic lattice. Similarly, the metal layer 332 may be $TaN_c$ of body-centered cubic lattice, wherein c is less than 0.5 but not zero, but more preferably between 0.1 and 0.3, or substantially nitrogen-free tantalum of body-centered cubic lattice.

In this embodiment, the tantalum nitride layer 311 is preferably between 10 and 200 Å thick, and more preferably approximately 60 Å thick. The tantalum layer 312 is preferably between 300 and 600 Å thick, and more preferably approximately 200 Å thick. The aluminum-copper alloy layer 313 is preferably between 500 and 2000 Å thick for substantially and effectively lowering the resistance of the bottom plate 110, and is more preferably approximately 1000 Å. The tantalum nitride layer 314 is preferably between 0 and 200 Å thick, and more preferably approximately 60 Å thick. The tantalum layer 315 is preferably between 300 and 600 Å thick, and more preferably approximately 400 Å thick. The dielectric layer 320 is preferably between 200 and 500 Å thick, and more preferably approximately 380 Å thick. The tantalum nitride layer 331 is preferably between 10 and 200 Å thick, and more preferably approximately 60 Å thick. The tantalum layer 332 is preferably between 300 and 600 Å thick, and more preferably approximately 400 Å thick. The step difference $H_3$ between the logic area 201 and the non-logic area 202 prior to formation of the inter-layer dielectric 240 and the wiring layer 250 is approximately 3500 Å, which is slightly greater than the value of $H_2$ in the second embodiment. The value of $H_3$, however, is still lower than the value of $H_1$ in the first embodiment. Thus, the third embodiment achieves the resistance decrease to the bottom plate 210 and top plate 230, with one of the additional benefits which is lower step difference $H_3$.

FIGS. 4A through 4G show cross sections of an exemplary fabrication method of the inventive semiconductor device. The subsequent flow is for fabricating the semiconductor device of the second embodiment, and can still be utilized for fabricating the semiconductor device of the third embodiment.

As described in the above embodiments, the top and bottom plates of metal-insulator-metal capacitors preferably substantially comprise metal of nitrogen-free body-centered cubic lattice, such as niobium, tantalum, thallium, or a combination thereof. The top and bottom plates of metal-insulator-metal capacitors preferably comprise substantially nitrogen-free tantalum of body-centered cubic lattice. Tantalum, for example, has two solid phases, wherein one is of tetragonal lattice, and the other is body-centered cubic lattice. The resistivity of a tantalum layer of tetragonal lattice is typically between 160 and 180 $\mu\Omega$-cm, and the resistivity of a tantalum layer of body-centered cubic lattice is typically between 20 and 40 $\mu\Omega$-cm. A tantalum player of tetragonal lattice is typically deposited when the conditions of deposition process thereof is not specially controlled. Thus, the inventors disclose a process for fabrication a nitrogen layer tantalum layer of body-centered cubic.

Figure 4A:
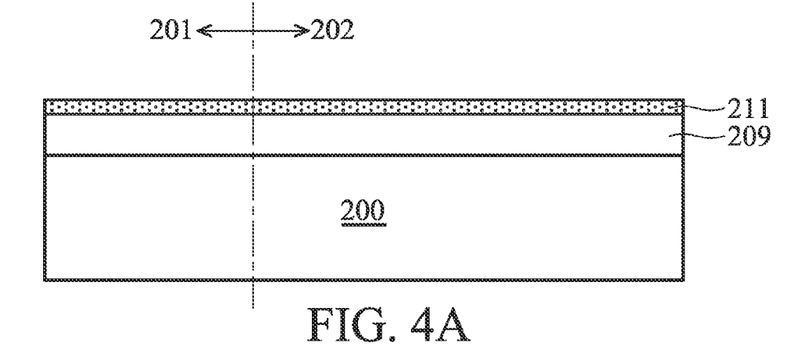
FIGS. 4A through 4G show cross sections of an exemplary method for fabricating the inventive semiconductor device.

In FIG. 4A, a substrate 200 as described for the second embodiment is provided. In this embodiment, the substrate 200 comprises an optional overlying etch stop layer 209. In other embodiments, the overlying etch stop layer 209 may be omitted or ignored. A nitride layer 211, such as tantalum nitride, is then formed overlying the substrate 200. The nitride layer 211 can be formed by a method such as evaporation, sputtering, or other known deposition methods and disposed on the overlying etch stop layer 209. In this embodiment, the overlying etch stop layer 209 comprises SiN of approximately 750 Å thick. In other embodiments, the overlying etch stop layer 209 may comprise other materials with a predetermined thickness as desired. The nitride layer 211 is preferably between 10 and 200 Å thick. The nitride layer 211 is utilized as a seed layer for formation of a substantially nitrogen-free layer of body-centered cubic lattice.

Figure 4B:
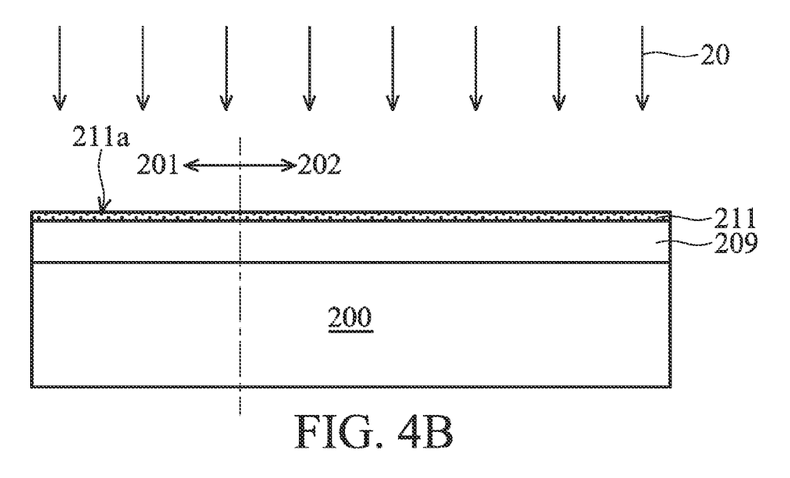

In FIG. 4B, a plasma treatment procedure is performed on the nitride layer 211, during which inert gas plasma 20, such as helium, argon, or a combination thereof, bombards the surface 211a of the nitride layer 211 and removes a predetermined thickness of the nitride layer 211. In this step, transfer of the crystallography of the surface 211a into body-centered cubic lattice for nucleation of a metal layer of body-centered cubic lattice is desired.

Figure 5:
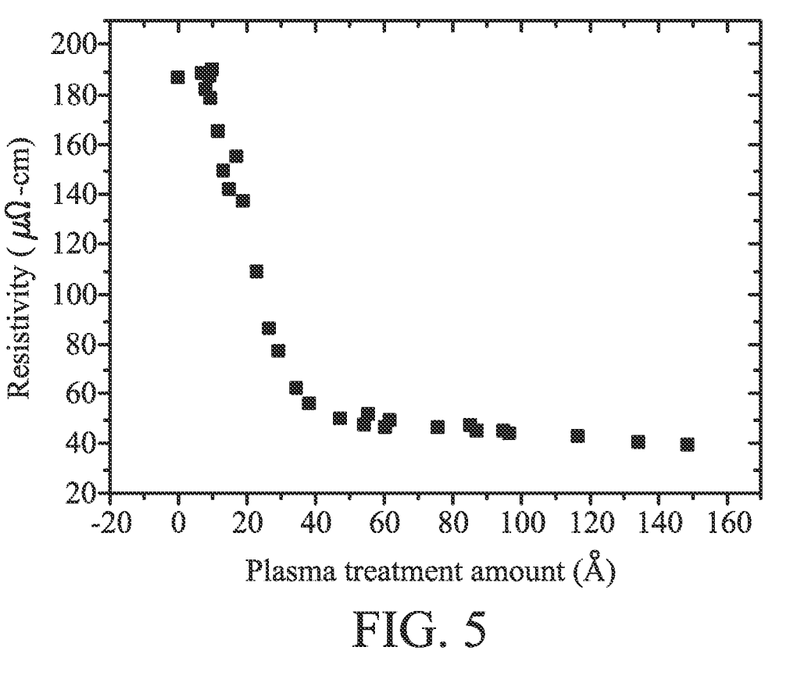
FIG. 5 is graph of an experimental data for the inventive semiconductor device.

Referring to FIG. 5, an experiment result of bombardment to the surface 211a is shown. A plurality of tantalum nitride layers of approximate 200 Å thick are formed by the same method and the same condition for this experiment. The surface of the tantalum nitride layers are bombarded by plasma, reducing the different predetermined amount of thickness of each experimental tantalum nitride layer. The distribution of the thickness reduction in the experiment is from 0 (not bombarded) to approximately 150 Å. Tantalum containing layers are then formed on the plasma treated tantalum nitride layers, followed by measuring the resistivity of the tantalum containing layers. In the graph of FIG. 5, the x-axis, Plasma treatment amount (Å), means the reduced thickness of the tantalum nitride layers by the plasma treatment, and the y-axis, Resistivity ($\mu\Omega$-cm), means measured resistivity of a tantalum containing layer formed on the plasma treated tantalum nitride layer of the predetermined thickness reduction value. For example, the resistivity value of a tantalum containing layer formed on the plasma treated tantalum nitride layer, whose thickness reduction value is 0, is approximately 188 $\mu\Omega$-cm, and the experimental data thereof is recorded at the (0, 188) coordinate position in the graph of FIG. 5. Other experimental data are recorded in the same way, completing the graph of FIG. 5. As described, the resistivity of a tantalum containing layer of body-centered cubic lattice is typically between 20 and 40 $\mu\Omega$-cm. As shown in FIG. 5, the thickness reduction value for a tantalum nitride layer is thus preferably set as 40 Å or greater to achieve a tantalum containing layer of body-centered cubic lattice formed thereon.

Referring back to FIG. 4B, thickness of the nitride layer 211 decreased by plasma bombardment is preferably 40 Å or greater according the experimental results shown in FIG. 5. Further, the condition of the inert gas plasma is preferably controlled to effectively achieve the predetermined thickness reduction value for the nitride layer 211. When plasma 20 is argon, the preferred conditions comprise:

Ar flow: from about 10 to 60 sccm and more preferably from about 20 to 50 sccm;

time: preferably from about 5 to 30 seconds and more preferably from about 15 to 25 seconds; and DC power: preferably from about 0 to 10000 W and more preferably from about 2000 to 5000 W.

RF bias power: preferably from about 0 to 2000 W and more preferably from about 1200 W.

Subsequent to the plasma treatment, the surface crystallography of the nitride layer 211 is preferably confirmed utilizing a method such as X-Ray diffraction, secondary electron detection, or other method. In this embodiment, the crystallography of the surface 211a becomes $TaN_x$ of body-centered cubic lattice, wherein x is approximately 0.1.

Figure 4C:
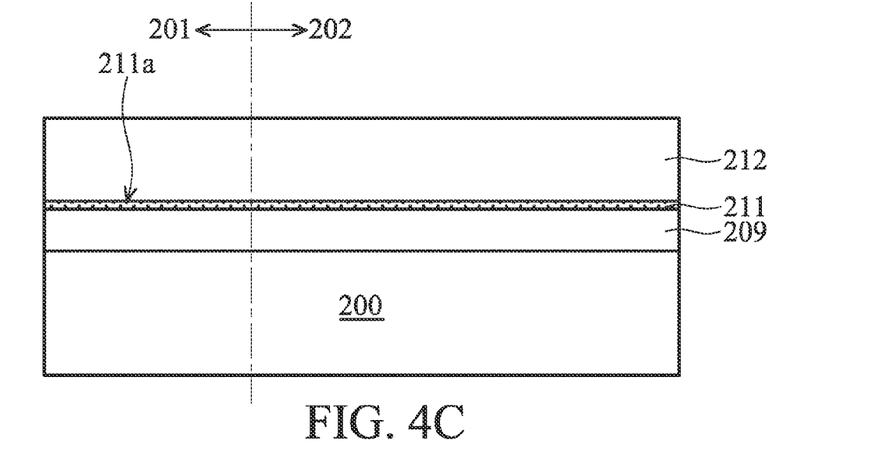

In FIG. 4C, the metal layer 212, such as tantalum, is formed overlying the nitride layer 211 by a method such as sputtering, evaporation, or other known deposition methods. The deposited tantalum and other composition atoms can nucleate on the surface 211a of body-centered cubic lattice, and then grow to be a layer of body-centered cubic lattice acting as the metal layer 212 at a temperature such as room temperature. The surface 211a becomes the interface between the nitride layer 211 and the metal layer 212 after formation of the metal layer 212. It is appreciated that formation of the surface 211a of body-centered cubic lattice achieves formation of the metal layer 212 at room temperature, increasing flexibility in thermal budget design for the process of the semiconductor device.

Figure 4D:
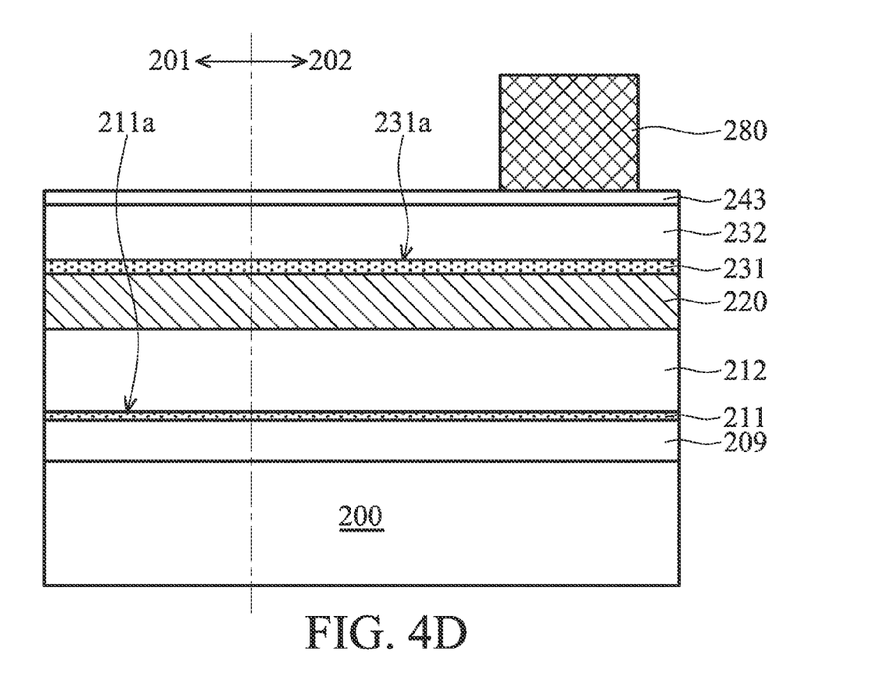

In FIG. 4D, after formation of the metal layer 212, the dielectric 220 is formed overlying the metal layer 212 by a method such as chemical vapor deposition or other known deposition methods. The nitride layer 231 is then formed overlying the dielectric layer 220 by the same method for forming the nitride layer 211. A plasma treatment procedure similar with that shown in FIG. 4B is then performed on the nitride layer 231 to form the surface 231a of body-centered cubic lattice. In this embodiment, the nitride layer 231 is tantalum nitride, and the surface 231a is $TaN_x$ of body-centered cubic lattice, wherein x is approximately 0.1. Thereafter, the metal layer 232 is formed overlying the nitride layer 231 as the formation of the metal layer 212. In this embodiment, an optional etch stop layer 243 comprising SiON is formed on the metal layer 232. The etch stop layer 243 is preferably between 100 and 500 Å thick, and more preferably 200 and 400 Å thick, but is approximately 300 Å thick in this embodiment. In an alternative embodiment, the etch stop layer 243 may comprise other materials with a predetermined thickness as desired. In other embodiments, the formation of the etch stop layer 243 can be omitted. A patterned mask layer 280 is then formed overlying the metal layer 232, covering the parts thereof predetermined to be the top plate 230 shown in FIG. 2. In this embodiment, the patterned mask layer 280 is formed on the etch stop layer 243.

Figure 4E:
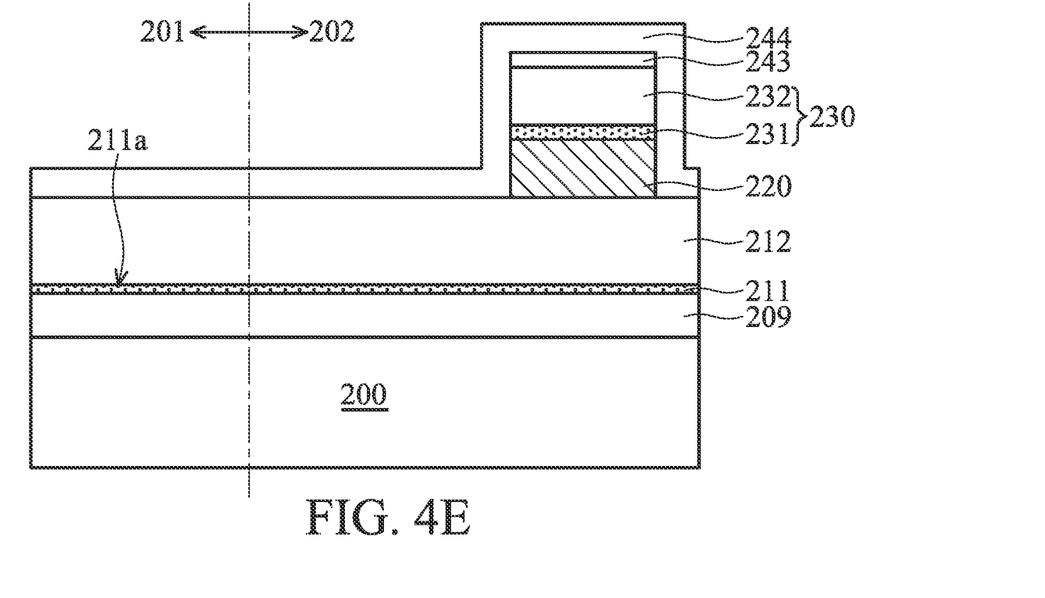

In FIG. 4E, the metal layer 232, the nitride layer 231, the dielectric layer 220, and the optional etch stop layer 243 are patterned utilizing the patterned mask layer 280 shown in FIG. 4D as a mask by a method such as etching, and the patterned mask layer 280 is then removed. Thus, the top plate 230 of the metal-insulator-metal capacitor in the non-logic area 202 is formed. An optional etch stop layer 244 can be conformally formed overlying the metal layer 212 and the patterned metal layer 232, nitride layer 231, dielectric layer 220, and optional etch stop layer 243 as desired. In this embodiment, the optional etch stop layer 244 comprises SiN, and is preferably between 100 and 1000 Å thick, and more preferably between 200 and 800 Å thick, but is 500 Å thick in this embodiment. In an alternative embodiment, the etch stop layer 244 may comprise other materials different from that of the optional etch stop layer 243 with a predetermined thickness as desired. In other embodiments, the formation of the etch stop layer 244 can be omitted.

Figure 4F:
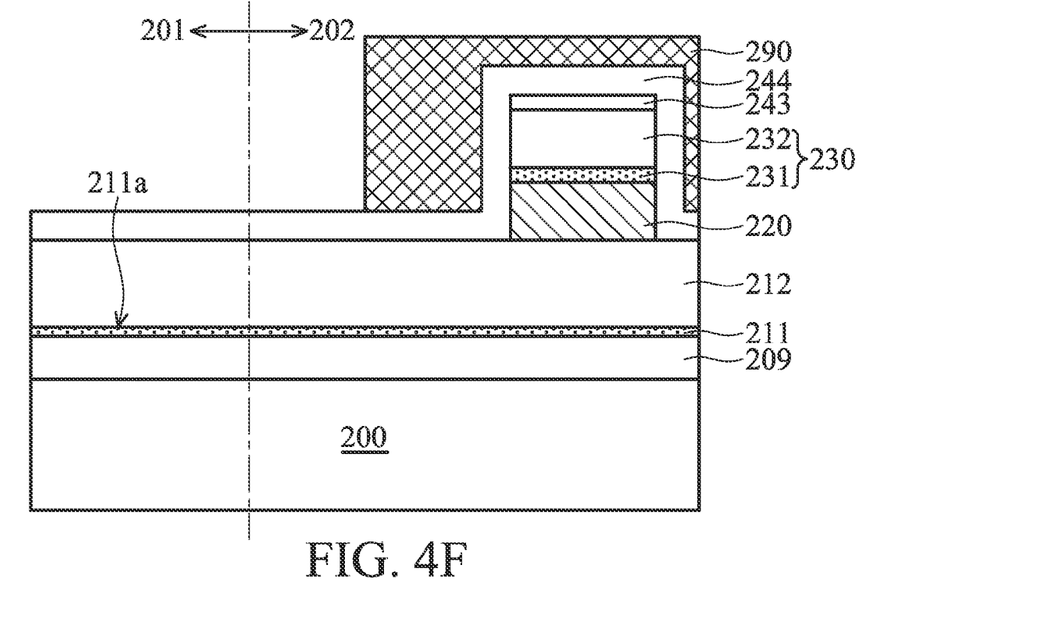

In FIG. 4F, a patterned mask layer 290 is formed, covering the top plate 230 and parts of the metal layer 212 predetermined to be the bottom plate 210 shown in FIG. 2. When the substrate 200 optionally comprises the overlying etch stop layer 209, an over-etch procedure can be performed on the exposed nitride layer 211 and metal layer 212 to ensure complete removal thereof, and thus, the portion 209a beyond the metal-insulator-metal capacitor 205 maybe thinned. In this embodiment, the portion 209a beyond the metal-insulator-metal capacitor 205 is approximately 500 Å thick, and the portion 209b below the nitride layer 211 is approximately 750 Å thick, equal to the original thickness of the overlying etch stop layer 209.

Figure 4G:
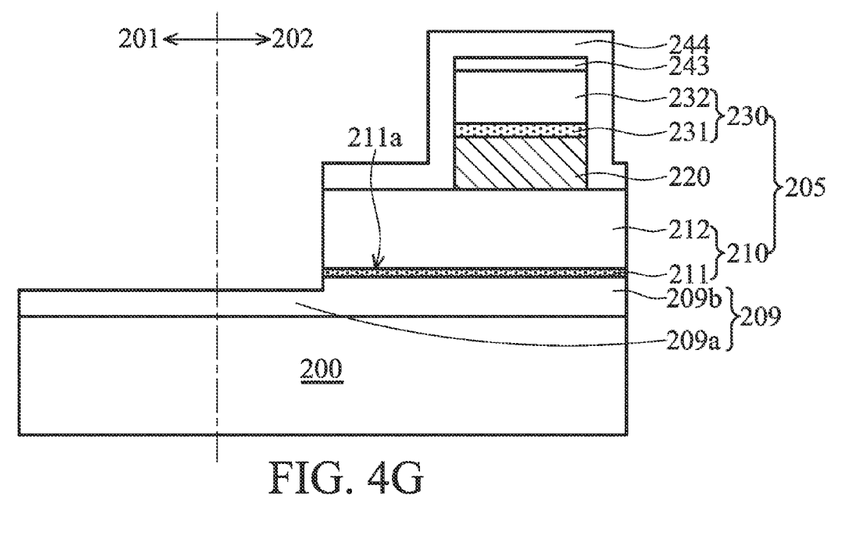

In FIG. 4G, the metal layer 212 and the nitride layer 211 are patterned utilizing the patterned mask layer 290 shown in FIG. 4F as a mask by a method such as etching, forming the bottom plate 210. Thus, the metal-insulator-metal capacitor in the non-logic area 202 is complete. A known metallization technology is then performed to form the dielectric layer 240 and the wiring layer 250 as shown in FIG. 2, completing the inventive semiconductor device.

Regarding the formation of the semiconductor shown in FIG. 3, the formation of the nitride layer 311, the metal layers 312, the nitride layer 314, the metal layers 315, the nitride layer 331, and the metal layers 332 can follow the flows described for FIGS. 4A and 4B, and thus, Description of thereto further description thereof is omitted. The formation of the dielectric layer 320 is similar to that of the dielectric 220 shown in FIG. 4D. The aluminum-copper alloy layer 313 is formed overlying the metal layers 312 prior to the formation of the nitride layer 314 by a method such as known physical vapor deposition, chemical vapor deposition electroplating, electroless plating, or other known deposition methods. The formation of the top plate 330 and the bottom plate 310 may also be similar with that of the top plate 230 and the bottom plate 210 shown in FIGS. 4D through 4D.

Figure 6:
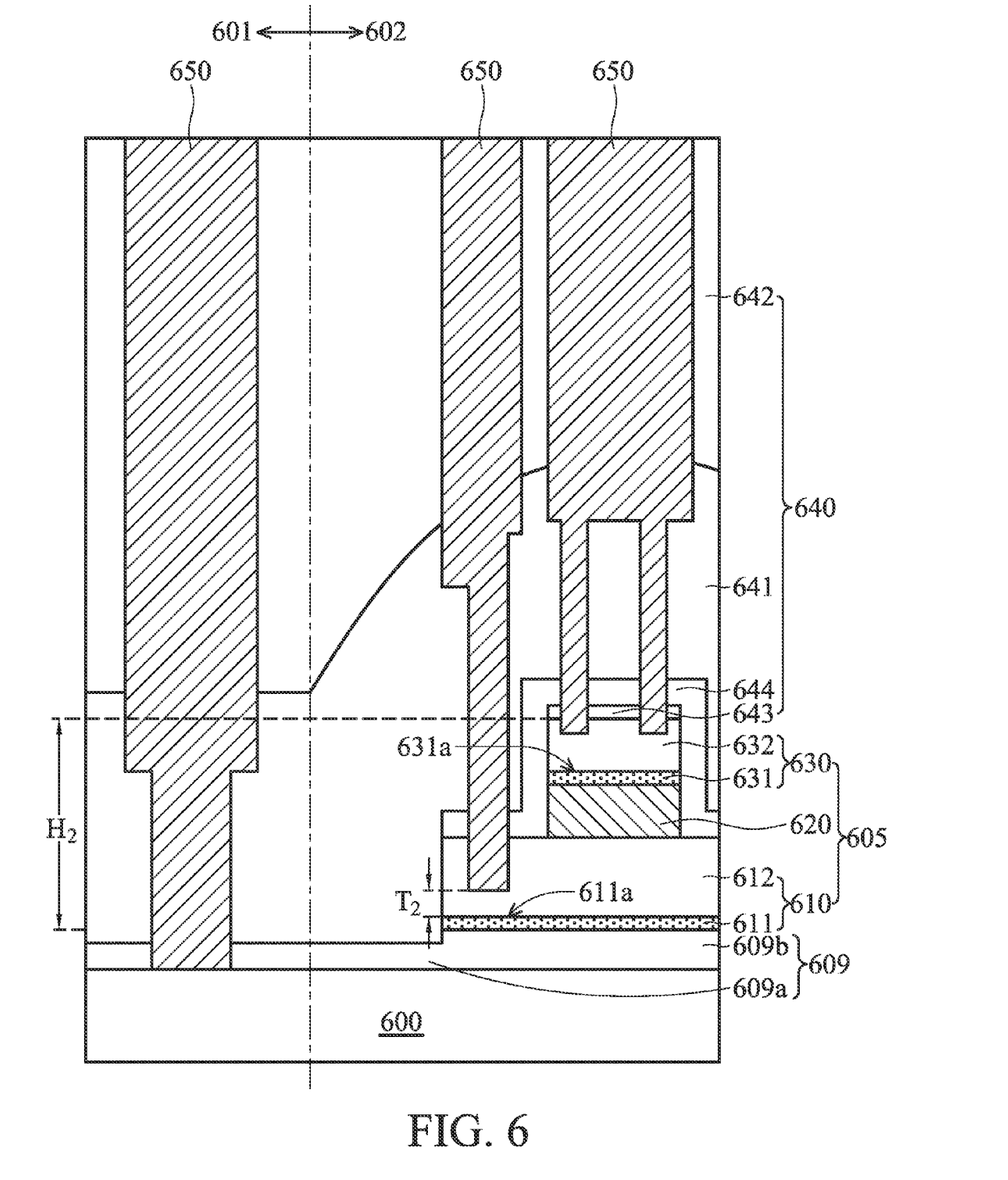
FIG. 6 shows a cross section of a fourth embodiment of the inventive semiconductor device.

FIG. 6 shows a cross section of a fourth embodiment of the inventive semiconductor device. The semiconductor device comprises a substrate 600, a metal-insulator-metal capacitor 605, an inter-layer dielectric 640, and a wiring layer 650. Description of the substrate 600 including the logic area 601, the non-logic area 602, and the optional overlying etch stop layer 609 comprising the portions 609a and 609b, the inter-layer dielectric 640 including the dielectric layers 641, 642 and the optional etch stop layers 643, 644, the thickness $T_2$, and the wiring layer 650 are similar to the descriptions of the substrate 100 including the logic area 101, the non-logic area 102, and the optional overlying etch stop layer 109 comprising the portions 109a and 109b, the inter-layer dielectric 140 including the dielectric layers 141, 142 and the optional etch stop layers 143, 144, the thickness $T_1$, and the wiring layer 150 of the first embodiment, and thus, further description thereof is omitted.

The metal-insulator-metal capacitor 605 comprises a bottom plate 610, a dielectric layer 620 overlying the bottom plate 610, and a top plate 630 overlying the dielectric layer 620. The bottom plate 610 extends horizontally from the stack of the bottom plate 610, the dielectric layer 620, and the top plate 630. Thus, at least one of the wiring layers can electrically contact the bottom plate 610. Further, Description of the dielectric layer 620 is the same as the description of the dielectric layer 120 of the first embodiment, and thus, further description thereof is omitted.

The bottom plate 610 is typically metal, and comprises metal of body-centered cubic lattice to lower the resistivity thereof. Thus, the top plate 630 is typically metal, and preferably comprises metal of body-centered cubic lattice. In some embodiments, the bottom plate 610 and the top plate 630 respectively comprise metal layers 612, and 632 and underlayers 611, and 631. The metal layers 612 and 632 are metal of body-centered cubic lattice and respectively comprise niobium (Nb), tantalum (Ta), thallium (Tl), or a combination thereof. The underlayers 611 and 631 are respectively disposed underlying the metal layers 612 and 632, and respectively comprises titanium (Ti), tungsten (W) molybdenum (Mo) or niobium (Nb). Note the underlayers 611 and 631 are metal of body-centered cubic lattice. Table 1 shows the relevant crystallographic data for the Ta (alpha), titanium (Ti), niobium (Nb), tungsten (W) and molybdenum (Mo).

TABLE 1

| | Crystal structure | atomic volume | a lattice constant on <111> | b lattice constant on <111> | lattice misfit (a axis) | lattice misfit (b axis) |
|---|---|---|---|---|---|---|
| Ta(alpha) | bcc | 10.9 | 2.86 | 3.31 | | |
| Ti | bcc | 10.64 | 2.86 | 3.31 | 0.00% | 0.00% |
| Nb | bcc | 10.87 | 2.86 | 3.3 | 0.00% | 0.30% |
| W | bcc | 9.53 | 2.74 | 3.16 | 4.20% | 4.53% |
| Mo | bcc | 9.4 | 2.73 | 3.15 | 4.20% | 4.53% |

An interface 611a between the underlayers 611 and the metal layers 612 is of body-centered cubic lattice for nucleation and grain growth of the metal layers 612 during processing. Similarly, an interface 631a between the nitride layers 631 and the metal layers 632 is of body-centered cubic lattice for nucleation and grain growth of the substantially nitrogen-free metal layers 632 during processing.

In some embodiments, to ensure the process integrity for fabricating the complete semiconductor device, the metal of body-centered cubic lattice in the bottom plate 610 and top plate 630 is preferably tantalum compatible with the metallization process for the semiconductor device, such as the step to fabricate barrier layers (not shown) of the wiring layer 650. In this embodiment, thus, the substantially metal layers 612 and 632 are respectively tantalum containing layers of body-centered cubic lattice, the underlayers 611 and 631 are respectively titanium (Ti) layers. The interfaces 611a and 631a are of body-centered cubic. In some embodiments, the metal layer 612 is $TaN_a$ of body-centered cubic lattice, wherein a is less than 0.5 but not zero, but more preferably between 0.1 and 0.3. In other embodiments, the metal layer 612 is substantially nitrogen-free tantalum of body-centered cubic lattice. Similarly, the metal layer 632 may be $TaN_b$ of body-centered cubic lattice, wherein b is less than 0.5 but not zero, but more preferably between 0.1 and 0.3, or substantially nitrogen-free tantalum of body-centered cubic lattice.

In this embodiment, the titanium (Ti) layer 611 is preferably between 10 and 200 Å thick, and more preferably approximately 60 Å thick. The tantalum layer 612 is preferably between 300 and 600 Å thick, and more preferably approximately 400 Å thick. The dielectric layer 620 is preferably between 200 and 500 Å thick, and more preferably approximately 380 Å thick. The titanium (Ti) layer 631 is preferably between 10 and 200 Å thick, and more preferably approximately 60 Å thick. The tantalum layer 632 is preferably between 300 and 600 Å thick, and more preferably approximately 400 Å thick. The step difference $H_2$ between the logic area 601 and the non-logic area 602 prior to formation of the inter-layer dielectric 640 and the wiring layer 650 is approximately 200 Å, much lower than the value of $H_1$ in the first embodiment. Thus, the fourth embodiment achieves the resistance decrease to the bottom plate 610 and top plate 630, with one of the additional benefits which is lower step difference $H_2$.

When the weight of lower resistance is larger than the weight for lower step difference of the substrate, an aluminum-copper alloy layer, for example, can be introduced into the bottom plate 610 comprising metal of nitrogen-free body-centered cubic lattice.

Figure 7:
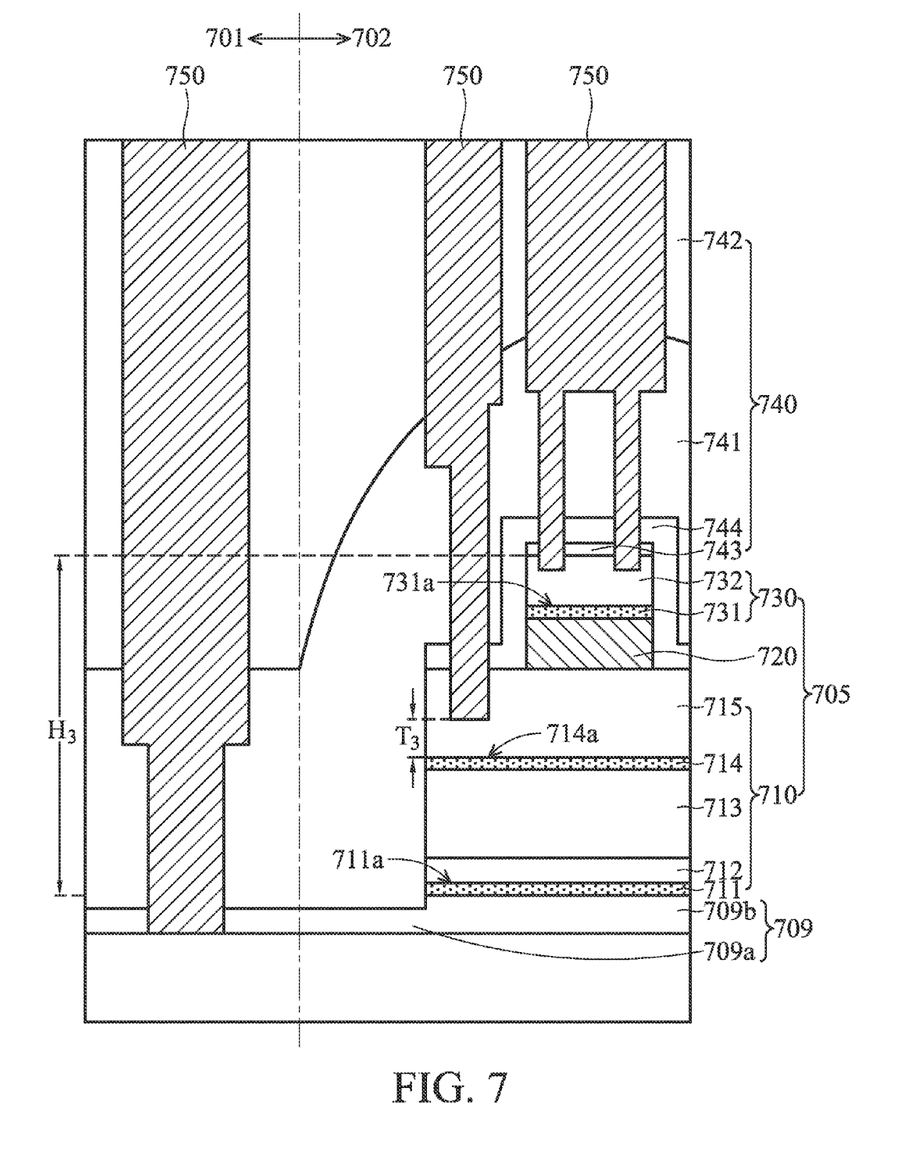
FIG. 7 shows a cross section of a fifth embodiment of the inventive semiconductor device.

FIG. 7 shows a cross section of a fifth embodiment of the inventive semiconductor device. The semiconductor device comprises a substrate 700, a metal-insulator-metal capacitor 705, an inter-layer dielectric 740, and a wiring layer 750. Description of the substrate 700 including the logic area 701, the non-logic area 702, and the optional overlying etch stop layer 709 comprising the portions 709a and 709b, the inter-layer dielectric 740 including the dielectric layers 741, 742 and the optional etch stop layers 743, 744, the thickness $T_3$, and the wiring layer 750 are similar with the description for the substrate 100 including the logic area 101, the non-logic area 102, and the optional overlying etch stop layer 109 comprising the portions 109a and 109b, the inter-layer dielectric 140 including the dielectric layers 141, 142 and the optional etch stop layers 143, 144, the thickness $T_3$, and the wiring layer 150, and thus, further description thereof is omitted.

The metal-insulator-metal capacitor 705 comprises a bottom plate 710, a dielectric layer 720 overlying the bottom plate 710, and a top plate 730 overlying the dielectric layer 720. The bottom plate 710 extends horizontally from the stack of the bottom plate 710, the dielectric layer 720, and the top plate 730. Thus, at least one of the wiring layers can electrically contact the bottom plate 710. Description of the top plate 730, including the underlayer 731, the substantially nitrogen-free metal layer 732, and the interface 731a, and the dielectric layer 720 are similar with the description of the top plate 630, including the underlayer 631, the substantially nitrogen-free metal layer 632, and the interface 631a, and the dielectric layer 620 in the fourth embodiment, and thus, further description thereof is omitted.

The bottom plate 710 comprises an underlayer 711, a metal layer 712, an aluminum-copper alloy layer 713, an underlayer 714, and a metal layer 715. The combination of the underlayer 711 and the metal layer 712, and the combination of the underlayer 714 and the metal layer 715 sandwiches the aluminum-copper alloy layer 713. Introducing the aluminum-copper alloy layer 713 further decreases the resistance of the bottom plate 710. In some embodiments, similar materials may be introduced on the top plate 730 for the decrease resistance. Description of the underlayers 711, 714, the metal layers 712, 715, and the interfaces 711a, 714a are similar with the description of the underlayer 611, the metal layers 612, and the interface 611a in the fourth embodiment, and thus, further description thereof is omitted.

In this embodiment, similar with the fourth embodiment, to ensure process integrity for fabricating the complete semiconductor device, the metal of body-centered cubic lattice in the bottom plate 710 and top plate 730 is preferably tantalum to be compatible with the metallization process for the semiconductor device, such as the step to fabricate barrier layers (not shown) of the wiring layer 750. In this embodiment, the metal layers 712, 715, and 732 are thus respectively tantalum containing layers of body-centered cubic lattice, the underlayers 711, 714 and 731 are respectively titanium (Ti) layers. The interfaces 711a, 714a, and 731a are of body-centered cubic lattice. In some embodiments, the metal layer 712 is $TaN_a$ of body-centered cubic lattice, wherein a is less than 0.5 but not zero, but more preferably between 0.1 and 0.3. In other embodiments, the metal layer 712 is substantially nitrogen-free tantalum of body-centered cubic lattice. Similarly, the metal layer 715 may be $TaN_b$ of body-centered cubic lattice, wherein b is less than 0.5 but not zero, but more preferably between 0.1 and 0.3, or substantially nitrogen-free tantalum of body-centered cubic lattice. Similarly, the metal layer 732 may be $TaN_c$ of body-centered cubic lattice, wherein c is less than 0.5 but not zero, but more preferably between 0.1 and 0.3, or substantially nitrogen-free tantalum of body-centered cubic lattice.

In this embodiment, the titanium (Ti) layer 711 is preferably between 10 and 200 Å thick, and more preferably approximately 60 Å thick. The tantalum layer 712 is preferably between 300 and 600 Å thick, and more preferably approximately 200 Å thick. The aluminum-copper alloy layer 713 is preferably between 500 and 2000 Å thick for substantially and effectively lowering the resistance of the bottom plate 110, and is more preferably approximately 1000 Å. The titanium (Ti) layer 714 is preferably between 0 and 200 Å thick, and more preferably approximately 60 Å thick. The tantalum layer 715 is preferably between 300 and 600 Å thick, and more preferably approximately 400 Å thick. The dielectric layer 720 is preferably between 200 and 500 Å thick, and more preferably approximately 380 Å thick. The titanium (Ti) layer 731 is preferably between 10 and 200 Å thick, and more preferably approximately 60 Å thick. The tantalum layer 732 is preferably between 300 and 600 Å thick, and more preferably approximately 400 Å thick. The step difference $H_3$ between the logic area 701 and the non-logic area 702 prior to formation of the inter-layer dielectric 740 and the wiring layer 750 is approximately 3500 Å, which is slightly greater than the value of $H_2$ in the fourth embodiment. The value of $H_3$, however, is still lower than the value of $H_1$ in the first embodiment. Thus, the fifth embodiment achieves the resistance decrease to the bottom plate 710 and top plate 730, with one of the additional benefits which is lower step difference $H_3$.

The efficacy of the inventive semiconductor devices including inventive metal-insulator-metal capacitors, provide lower plate resistivity and lower step difference on the substrates of the semiconductor devices.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a substrate;
    a first metal layer overlying the substrate;
    a dielectric layer overlying the first metal layer; and
    a second metal layer overlying the dielectric layer, wherein the first metal layer comprises:
    a first body-centered cubic lattice metal layer;
    a first underlayer, underlying the first body-centered cubic lattice metal layer, wherein the first underlayer is metal of body-centered cubic lattice and comprises titanium (Ti), tungsten (W), molybdenum (Mo) or niobium (Nb);
    wherein the second metal layer comprises:
    a second body-centered cubic lattice metal layer;
    a second underlayer, underlying the second body-centered cubic lattice metal layer; and
    a second interface of body-centered cubic lattice between the second body-centered cubic lattice metal layer and the second underlayer,
    wherein the first metal layer further comprises:
    an aluminum-copper alloy layer underlying the first underlayer;
    a third body-centered cubic lattice metal layer underlying the aluminum-copper alloy layer;
    a third underlayer, underlying the third body-centered cubic lattice metal layer; and
    a third interface of body-centered cubic lattice between the third body-centered cubic lattice metal layer and the third underlayer; and
    a first interface of body-centered cubic lattice between the first body-centered cubic lattice metal layer and the first underlayer.

2. The device as claimed in claim 1, wherein the first and second metal layers are respectively selected from a group consisting of niobium, tantalum, thallium, and a combination thereof.

3. The device as claimed in claim 1, wherein
    the first and second underlayers are titanium (Ti) layers;
    the first and second body-centered cubic lattice metal layers are tantalum containing layers; and
    the first and second interfaces are of body-centered cubic lattice.

4. The device as claimed in claim 1, wherein
    the first, second, and third underlayers are titanium (Ti) layers;
    the first, second, and third body-centered cubic lattice metal layers are tantalum containing layers; and
    the first, second, and third interfaces are of body-centered cubic lattice.

5. The device as claimed in claim 3, wherein the tantalum containing layers are $TaN_a$, and a is less than 0.5.

6. The device as claimed in claim 4, wherein
    the first tantalum containing layers are $TaN_b$, and b is less than 0.5.

* * * * *